US011367677B2

(12) United States Patent
Somada et al.

(10) Patent No.: US 11,367,677 B2
(45) Date of Patent: Jun. 21, 2022

(54) ELECTRONIC COMPONENT MODULE

(71) Applicant: Murata Manufacturing Co., Ltd., Nagaokakyo (JP)

(72) Inventors: Hiroshi Somada, Nagaokakyo (JP); Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/724,422

(22) Filed: Dec. 23, 2019

(65) Prior Publication Data

US 2020/0126898 A1    Apr. 23, 2020

Related U.S. Application Data

(63) Continuation of application No. PCT/JP2018/024315, filed on Jun. 27, 2018.

(30) Foreign Application Priority Data

Jun. 30, 2017  (JP) .............................. JP2017-129932

(51) Int. Cl.
*H01L 23/498*   (2006.01)
*H01L 21/48*    (2006.01)
(Continued)

(52) U.S. Cl.
CPC ...... *H01L 23/49827* (2013.01); *H01L 21/486* (2013.01); *H01L 21/4853* (2013.01); *H01L 21/568* (2013.01); *H01L 21/6835* (2013.01); *H01L 23/3128* (2013.01); *H01L 23/49816* (2013.01); *H01L 23/49838* (2013.01);
(Continued)

(58) Field of Classification Search
CPC ............... H01L 27/3276; H01L 21/486; H01L 21/4857; H01L 21/56; H01L 21/565; H01L 21/76898; H01L 23/4857; H01L 23/49822; H01L 23/49827; H01L 23/49838
See application file for complete search history.

(56) References Cited

U.S. PATENT DOCUMENTS 6,323,439 B1 * 11/2001 Kambe ................ H05K 3/0038
174/255
6,975,516 B2 * 12/2005 Asahi ...................... H01L 25/50
361/761
(Continued)

FOREIGN PATENT DOCUMENTS

JP      2005-310954 A      11/2005
JP      2005-311249 A      11/2005
(Continued)

OTHER PUBLICATIONS

Official Communication issued in International Patent Application No. PCT/JP2018/024315, dated Aug. 21, 2018.

*Primary Examiner* — Jaehwan Oh
*Assistant Examiner* — John M Parker
(74) *Attorney, Agent, or Firm* — Keating & Bennett, LLP

(57) ABSTRACT

An electronic component module includes an electronic component, a structure body, a through wiring, and an insulator. The structure body covers at least a portion of the electronic component and has conductivity. The through wiring extends through the structure body. The insulator is disposed at least between the through wiring and the structure body.

18 Claims, 7 Drawing Sheets

(51) Int. Cl.
  *H01L 21/56*  (2006.01)
  *H01L 21/683*  (2006.01)
  *H01L 23/31*  (2006.01)
  *H01L 23/538*  (2006.01)
  *H01L 25/10*  (2006.01)

(52) U.S. Cl.
  CPC .... *H01L 23/49866* (2013.01); *H01L 23/5384* (2013.01); *H01L 23/5386* (2013.01); *H01L 23/5389* (2013.01); *H01L 25/105* (2013.01); *H01L 2221/68345* (2013.01); *H01L 2221/68359* (2013.01); *H01L 2225/1035* (2013.01); *H01L 2225/1058* (2013.01)

(56) References Cited

U.S. PATENT DOCUMENTS

| | | | |
|---|---|---|---|
| 2005/0255303 A1 | 11/2005 | Sawatari et al. | |
| 2016/0322340 A1* | 11/2016 | Li | H01L 23/055 |
| 2017/0047302 A1* | 2/2017 | Morita | H01L 24/13 |
| 2017/0243854 A1* | 8/2017 | Sugiyama | H01L 21/4853 |

FOREIGN PATENT DOCUMENTS

| | | |
|---|---|---|
| JP | 2011-211099 A | 10/2011 |
| JP | 2014-110337 A | 6/2014 |
| JP | 2018-046298 A | 3/2018 |

\* cited by examiner

ELECTRONIC COMPONENT MODULE

CROSS REFERENCE TO RELATED APPLICATIONS

This application claims the benefit of priority to Japanese Patent Application No. 2017-129932 filed on Jun. 30, 2017 and is a Continuation Application of PCT Application No. PCT/JP2018/024315 filed on Jun. 27, 2018. The entire contents of each application are hereby incorporated herein by reference.

BACKGROUND OF THE INVENTION

1. Field of the Invention

The present invention generally relates to an electronic component module and, more specifically, relates to an electronic component module including an electronic component and a structure body.

2. Description of the Related Art

As an electronic component module, a semiconductor package that includes a semiconductor chip (electronic component), an insulation resin layer (resin structure body), a conductive post (through wiring), a connection terminal, a wiring layer, and a surface layer has been known (refer to, for example, Japanese Unexamined Patent Application Publication No. 2005-310954).

In the semiconductor package described in Japanese Unexamined Patent Application Publication No. 2005-310954, a connection terminal is disposed on an upper surface of a semiconductor chip, and the entirety, excluding a bottom surface portion, of the semiconductor chip, the connection terminal on the semiconductor chip, a conductive post, and a wiring layer are covered by an insulation resin layer.

In the electronic component module described in Japanese Unexamined Patent Application Publication No. 2005-310954, as described above, an electronic component is covered by the insulation resin layer. Therefore, the heat generated in the electronic component does not easily dissipate, resulting in insufficient heat dissipation, and characteristics of the electronic component module may be degraded.

SUMMARY OF THE INVENTION

Preferred embodiments of the present invention provide electronic component modules that each more efficiently dissipate heat generated in an electronic component while maintaining electrical insulation properties between a through wiring or a wiring layer and a structure body.

An electronic component module according to a preferred embodiment of the present invention includes an electronic component, a structure body, a through wiring, and an insulator. The structure body covers at least a portion of the electronic component and has conductivity. The through wiring extends through the structure body. The insulator is disposed at least between the through wiring and the structure body.

An electronic component module according to a preferred embodiment of the present invention includes an electronic component, a structure body, a through wiring, a wiring layer, and an insulator. The structure body covers at least a portion of the electronic component and has conductivity. The through wiring extends through the structure body. The wiring layer electrically connects the electronic component and the through wiring to each other. The insulator is disposed at least between the wiring layer and the structure body.

The electronic component modules according to preferred embodiments of the present invention each more efficiently dissipate the heat generated in the electronic component while maintaining electrical insulation properties between the through wiring or the wiring layer and the structure body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
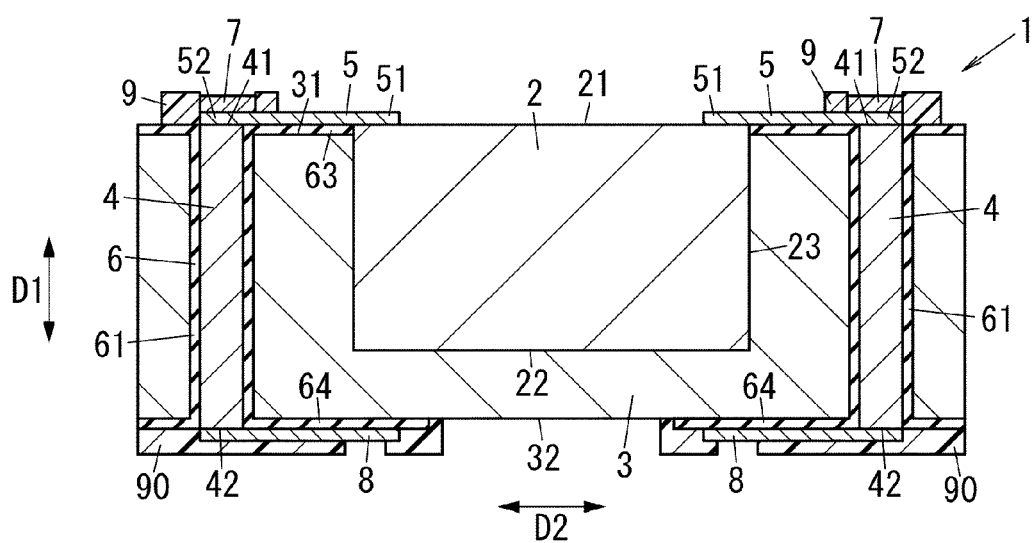
FIG. 1 is a sectional view of an electronic component module according to a first preferred embodiment of the present invention.

Hereinafter, electronic component modules according to first and second preferred embodiments will be described with reference to the drawings.

In the electronic component modules according to the following first and second preferred embodiments, a structure body that has conductivity holds an electronic component so as to cover at least a portion of a side surface of the electronic component.

Each of FIG. 1, FIG. 2, FIGS. 3A to 3F, FIGS. 4A to 4E, FIG. 5, FIGS. 6A to 6F, and FIGS. 7A to 7E referred to in the following preferred embodiments and the like is a schematic view, and a ratio of each of sizes and thicknesses of elements in the drawings does not necessarily reflect the actual dimension ratio.

First Preferred Embodiment (1) Overall Configuration of Electronic Component Module Hereinafter, an electronic component module 1 according to a first preferred embodiment of the present invention will be described with reference to the drawings.

As illustrated in FIG. 1, the electronic component module 1 according to the first preferred embodiment includes an electronic component 2, a structure body 3, a plurality (for example, two in the illustrated example) of through wirings 4, a plurality (for example, two in the illustrated example) of wiring layers 5, and an insulator 6. In the electronic component module 1, the structure body 3 holds the electronic component 2 and the through wirings 4. In the electronic component module 1, the structure body 3 protects the electronic component 2 from an impact, water, and the like from outside. The through wirings 4 are at the sides of the electronic component 2 and extends through the structure body 3 in the thickness direction (a predetermined direction) of the structure body 3. The wiring layers 5 electrically connect the electronic component 2 and the through wirings 4 to each other.

In addition, the electronic component module 1 further includes a plurality (for example, two in the illustrated example) of electrodes 7, an external-connection wiring layer 8, and a plurality of resist layers 9 and 90. In the electronic component module 1, the plurality of electrodes 7 are preferably electrodes for external connection. The external-connection wiring layer 8 is disposed to electrically connect the through wirings 4 to a circuit board 10 (refer to FIG. 2). The resist layers 9 are provided on the wiring layers 5. The resist layers 90 are provided on the external-connection wiring layer 8.

The electronic component module 1 is usable as, for example, an interposer (Interposer) interposed between an electronic component 20 (refer to FIG. 2), which is different from the electronic component 2, and the circuit board 10. The circuit board 10 is, for example, a printed wiring board.

(2) Elements of Electronic Component Module

Next, elements of the electronic component module 1 will be described with reference to the drawings.

(2.1) Electronic Component

As illustrated in FIG. 1, the electronic component 2 includes a surface 21 and a rear surface 22 opposite to each other in a first direction D1 of the electronic component module 1. More specifically, the electronic component 2 has a plate shape and includes the surface 21 and the rear surface 22 opposite to each other in the thickness direction of the electronic component 2. In addition, the electronic component 2 includes a side surface 23. The shape of the electronic component 2 in plan view (peripheral shape when the electronic component 2 is viewed in the thickness direction thereof) is rectangular but not limited to rectangular and may be, for example, square.

The electronic component 2 is, for example, a SAW (Surface Acoustic Wave) filter. The electronic component 2 is, however, not limited to a SAW filter and may be, for example, a BAW (Bulk Acoustic Wave) filter, a RF (Radio Frequency) switch, an active device, such as a semiconductor device, or a passive device, such as a multilayer ceramic capacitor and a thin-film capacitor. The different electronic component 20 described above is, for example, an IC (Integrated Circuit), an inductor, or a SAW filter. In a communication module 200 (refer to FIG. 2) that includes the electronic component module 1, a gap 202 (refer to FIG. 2) is provided between the surface 21 of the electronic component 2, which is a SAW filter, and the different electronic component 20 described above. The electronic component module 1 is electrically connected to the electronic component 20 by a plurality of conductive bumps 43 and electrically connected to the circuit board 10 by a plurality of conductive bumps 44.

When the electronic component 2 is a SAW filter, the electronic component 2 includes, for example, a piezoelectric substrate including a surface and a rear surface opposite to each other in the thickness direction, and a functional portion on the surface of the piezoelectric substrate. The piezoelectric substrate is, for example, a LiTaO$_3$ substrate or a LiNbO$_3$ substrate. The thickness of the piezoelectric substrate is, for example, approximately 200 µm. The functional portion includes, for example, one or a plurality of IDT (Interdigital Transducer) electrodes. The functional portion may include a terminal electrode for external connection. The number of terminal electrodes may be one, or two or more. When the electronic component 2 is a SAW filter, the surface 21 of the electronic component 2 includes, for example, an exposed portion of the surface of the piezoelectric substrate and an exposed surface of the functional portion. When the electronic component 2 is a SAW filter, the configuration thereof is not limited to a configuration including a bulk (Bulk) piezoelectric substrate and may be, for example, a configuration having a multilayer structure in which a silicon substrate, a silicon oxide film, and a piezoelectric thin film are laminated on each other in this order, with a functional portion (an IDT electrode, a terminal electrode, and the like) provided on the piezoelectric thin film. The piezoelectric thin film is, for example, a LiTaO$_3$ thin film or a LiNbO$_3$ thin film. The thickness of the piezoelectric thin film is preferably about 3.5λ or less where λ is a wave length of an acoustic wave determined in an electrode finger period of an IDT electrode. The thickness of the piezoelectric thin film is, for example, approximately 0.5 µm. The thickness of the silicon oxide film is preferably about 2.0λ or less. The thickness of the silicon oxide film is, for example, approximately 0.5 µm. The thickness of the multilayer structure is, for example, approximately 200 µm.

(2.2) Structure Body

As illustrated in FIG. 1, the structure body 3 is configured to hold the electronic component 2. The structure body 3 includes a first surface 31 and a second surface 32 opposite to each other in the first direction D1 of the electronic component module 1. More specifically, the structure body 3 is plate-shaped and the first surface 31 and the second surface 32 are opposite to each other in the thickness direction of the structure body 3. The shape of the structure body 3 in plan view (peripheral shape when the structure body 3 is viewed in the thickness direction thereof (first direction D1)) is rectangular, for example. Note that the shape of the structure body 3 in plan view is not limited to rectangular and may be, for example, square. The flat surface size of the structure body 3 is larger than the flat surface size of the electronic component 2.

The structure body 3 covers a portion of the side surface 23 and the rear surface 22 of the electronic component 2. In other words, the electronic component 2 is disposed inside the structure body 3. The structure body 3 holds the electronic component 2 with the surface 21 of the electronic component 2 being exposed.

The structure body 3 is, for example, a conductive structure body made of a metal or an alloy having conductivity, or a conductive resin that includes these substances (a metal or an alloy). More specifically, the structure body 3 is made of, for example, a conductive material that contains Cu. The structure body 3 is made of a porous metal. More specifically, the structure body 3 is made of a porous Cu structure body, not bulk Cu. The thermal conductivity of the structure body 3 is large compared with the thermal conductivity of a resin structure body. In addition, the structure body 3 is made of Cu, and the structure body 3 is thus made of a conductor having low magnetic permeability. Note that the metal included in the structure body 3 is not limited to Cu and may be, for example, a substance that has relative magnetic permeability of approximately 1, or 1 or less. An example of such a substance is Al or the like.

The structure body 3 is in contact with the electronic component 2. In other words, the structure body 3 holds the electronic component 2 in a state of being in contact with the electronic component 2 with no other member interposed between the structure body 3 and the electronic component 2.

(2.3) Through Wiring

As illustrated in FIG. 1, in the electronic component module 1, a plurality (for example, two in the illustrated example) of the through wirings 4 are disposed at the sides of the electronic component 2 in the structure body 3. In a second direction D2 orthogonal to the first direction D1, the plurality of through wirings 4 are spaced away from the electronic component 2. The plurality of through wirings 4 are held by the structure body 3.

The through wirings 4 each have a columnar shape (circular column shape, here) and each include a first end surface 41 and a second end surface 42 opposite to each other in a direction parallel to the thickness direction of the structure body 3. In short, the through wirings 4 each include the first end surface 41 and the second end surface 42 opposite to each other in the first direction D1. Second ends 52 of the wiring layers 5 are laminated on the first end surfaces 41 of the through wirings 4. Consequently, in the electronic component module 1, the through wirings 4 and the wiring layers 5 are electrically connected to each other.

In the electronic component module 1, the through wirings 4 are electrically connected to the electronic component with the wiring layers 5 interposed therebetween. In the electronic component module 1, the position and the number of the through wirings 4 are not particularly limited.

The material of the through wirings 4 is, for example, a metal or an alloy. In the electronic component module 1 according to the first preferred embodiment, the material of the through wirings 4 is, for example, Cu. The material of the through wirings 4 is not limited to Cu and may be, for example, Ni. The through wirings 4 are formed by, for example, electroplating.

(2.4) Wiring Layer

The wiring layers 5 electrically connect the electronic component 2 and the through wirings 4 to each other on the side of the first surface 31 of the structure body 3 and the side of the surface 21 of the electronic component 2. The wiring layers 5 each include a first end 51 connected to the surface 21 (a surface of a terminal portion of the surface 21) of the electronic component 2, and a second end 52 connected to the through wirings 4. The wiring layers 5 are disposed to extend over the surface 21 of the electronic component 2, the first end surfaces 41 of the through wirings 4, and an insulation portion 63, which will be described later, of the insulator 6. The thickness of the wiring layers 5 is, for example, about 5 μm or more and about 10 μm or less.

The material of the wiring layers 5 is, for example, a metal or an alloy. In the electronic component module 1 according to the first preferred embodiment, one example of the material of the wiring layers 5 is Cu. In short, the wiring layers 5 are Cu layers. The structure of the wiring layers 5 is not limited to a single-layer structure and may be a multilayer structure including a plurality of laminated layers. The wiring layers 5 are formed by, for example, sputtering or plating. The method of forming the wiring layers 5 is not limited to sputtering or plating and may be other formation methods.

Figure 2:
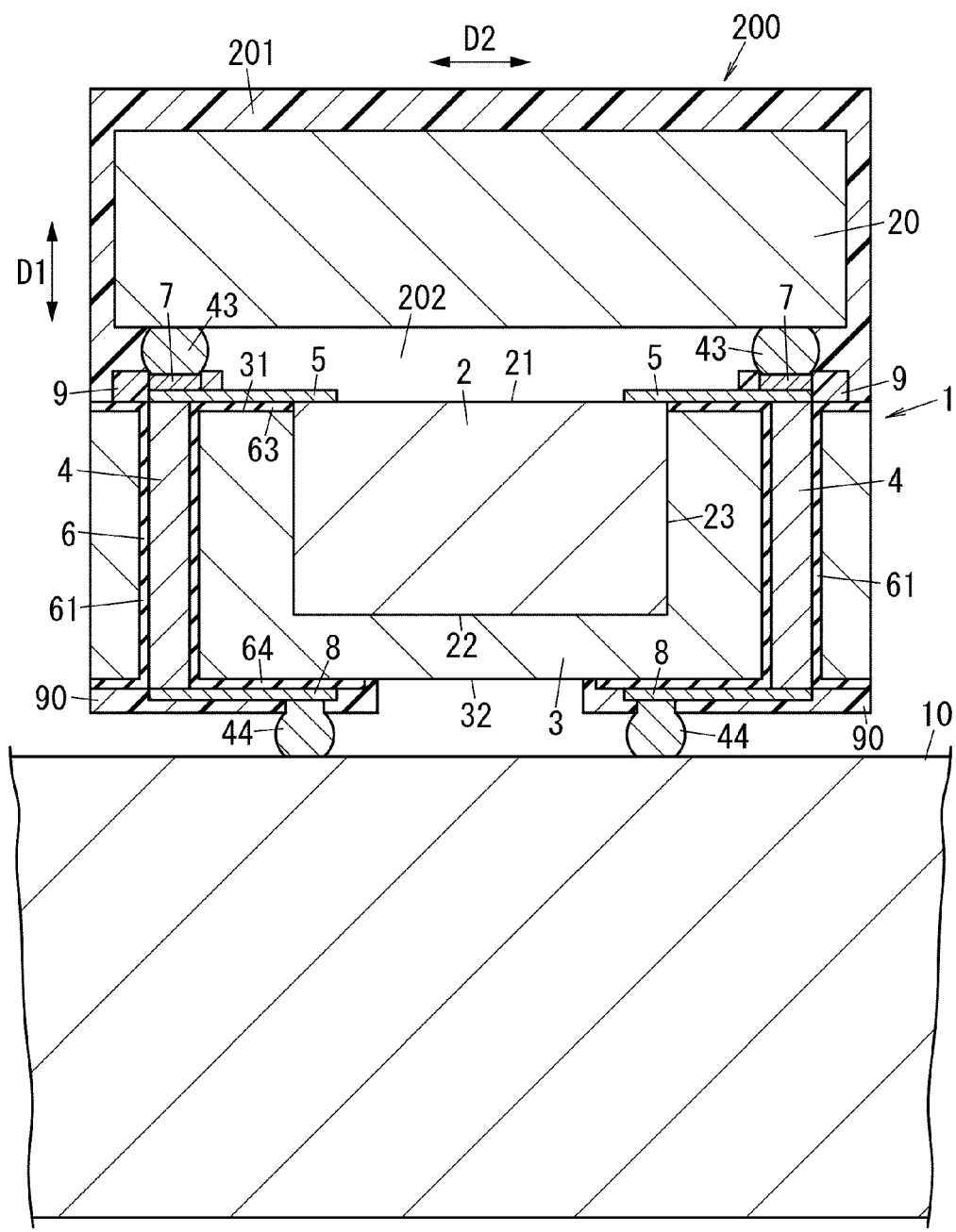
FIG. 2 is a sectional view of a communication module including the above-mentioned electronic module.

In addition to the wiring layers 5, the electronic component module 1 further includes the external-connection wiring layer 8 to electrically connect the through wirings 4 to the circuit board 10 (refer to FIG. 2). The external-connection wiring layer 8 is provided on the side of the second surface 32 of the structure body 3 so as to extend over the second end surfaces 42 of the through wirings 4 and an insulation portion 64, which will be described later, of the insulator 6. The thickness of the external-connection wiring layer 8 is, for example, about 5 μm or more and about 10 μm or less.

The material of the external-connection wiring layer 8 is, for example, a metal or an alloy. In the electronic component module 1 according to the first preferred embodiment, the material of the external-connection wiring layer 8 is Cu, as with the wiring layers 5. As with the wiring layers 5, the structure of the external-connection wiring layer 8 is not limited to a single-layer structure and may be a multilayer structure including a plurality of laminated layers. The external-connection wiring layer 8 is formed by, for example, sputtering or plating. Note that the method of forming the external-connection wiring layer 8 is not limited to sputtering or plating and may be other formation methods.

The electronic component module 1 further includes the resist layers 90 provided on the external-connection wiring layer 8. The resist layers 90 are made of a material that has lower wettability than the external-connection wiring layer 8. The resist layers 90 are, for example, polyimide layers. Consequently, in the electronic component module 1, it is possible to prevent solder from spreading out on the external-connection wiring layer during joining of the external-connection wiring layer 8 by soldering to the circuit board 10 and the like.

(2.5) Insulator

The insulator 6 includes a plurality of insulation portions 61, the insulation portion 63, and the insulation portion 64. The insulation portions 61 are disposed between the structure body 3 and the through wirings 4 so as to surround the through wirings 4, and electrically insulate the structure body 3 and the through wirings 4 from each other. The insulation portions 61 are disposed to cover the entire circumferences, excluding the first end surfaces 41 and the second end surfaces 42, of the circular column-shaped through wirings 4. The insulation portion 63 is disposed between the structure body 3 and the wiring layers 5 so as to extend along the first surface 31 of the structure body 3 and electrically insulates the structure body 3 and the wiring layers 5 from each other. The insulation portion 64 is disposed between the structure body 3 and the external-connection wiring layer 8 so as to extend along the second surface 32 of the structure body 3 and electrically insulates the structure body 3 and the external-connection wiring layer 8 from each other. The plurality of insulation portions 61, the insulation portion 63, and the insulation portion 64 are integral with each other.

The insulator 6 is made of an inorganic insulation material. The inorganic insulation material used in the insulator 6 is, for example, a silicon oxide or a silicon nitride. The insulator 6 is, for example, a thin-film insulation layer that is thinner than the width of the through wirings 4 in the second direction D2. The film thickness of the thin-film insulation layer is, for example, about 0.1 μm or more and about 30 μm or less.

The structure body 3 is provided with such an insulator 6 described above with, of the second surface 32 of the structure body 3, a portion of a section overlapping the rear surface 22 in plan view in the first direction D1 being exposed by being not covered by the insulator 6.

(2.6) Electrode

The electronic component module 1 further includes a plurality (two in the illustrated example) of the external-connection electrodes 7 provided on the second ends 52 of the wiring layers 5. In addition, the electronic component module 1 further includes the resist layers 9 provided on the wiring layers 5. The resist layers 9 are made of a material that has lower wettability than the electrodes 7 and the wiring layers 5. The resist layers 9 are, for example, polyimide layers. Consequently, in the electronic component module 1, it is possible to prevent solder from spreading out on the wiring layers 5 during joining of the electrodes 7 by soldering to the different electronic component 20 and the like.

The electrodes 7 are, for example, multilayer films constituted by a Ti film on the second ends 52 of the wiring layers 5 and an Au film on the Ti film. The multilayer structure of the electrodes 7 is merely an example and is not limited to this one example.

(3) Method of Manufacturing Electronic Component Module

Next, a non-limiting example of a method of manufacturing the electronic component module 1 according to the first preferred embodiment will be described with reference to FIGS. 3A to 3F and FIGS. 4A to 4E.

In the method of manufacturing the electronic component module 1, a first step to a tenth step are sequentially performed after the electronic component 2 is prepared.

Figure 3A:
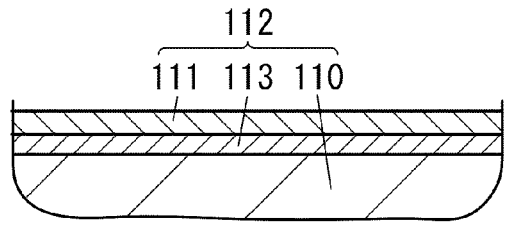
FIGS. 3A to 3F are sectional views for describing a method of manufacturing the above-mentioned electronic component module.
Figure 3D:
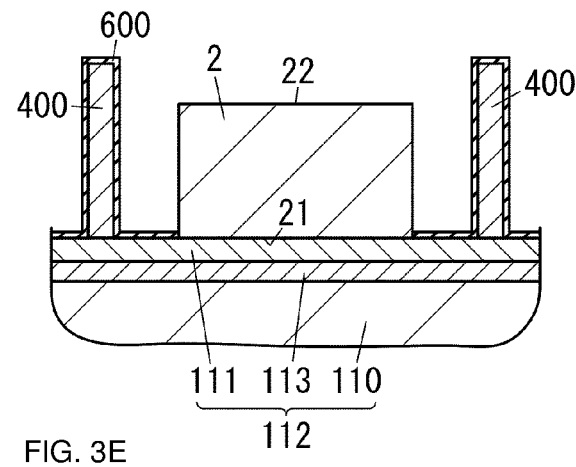

In the first step, as illustrated in FIG. 3A, a multilayer body 112 is prepared. The multilayer body 112 includes a flat plate-shaped support body 110 and a conductive layer 111 stuck to one surface of the support body 110 in the thickness direction by an adhesive layer 113.

Figure 3B:
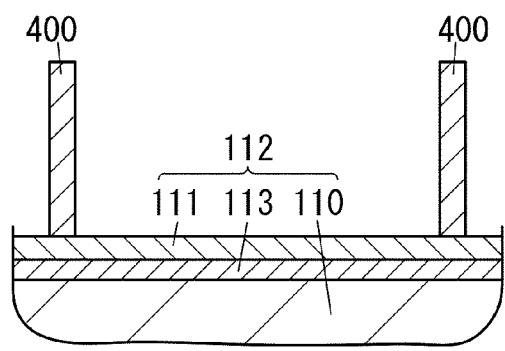
Figure 3E:
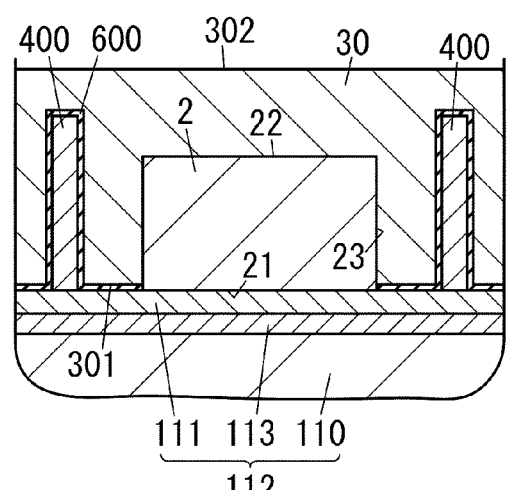

In the second step, as illustrated in FIG. 3B, a plurality of conductor pillars 400, which serve as elements of the through wirings 4, are formed on the conductive layer 111 of the multilayer body 112. In this step, first, a positive-type photoresist layer that covers the conductive layer 111 is formed. Thereafter, a portion in a location where the through wirings 4 are planned to be formed in the photoresist layer is removed (an opening is formed in the location where the through wirings 4 are planned to be formed) by using a photolithography technology, thus exposing a portion of the conductive layer 111, the portion defining and functioning as a ground of the through wirings 4. Thereafter, the conductor pillars 400 are formed by electroplating. To form the conductor pillars 400, a current is caused to flow between an anode disposed to face a surface of the photoresist layer with a plating solution containing copper sulfate interposed therebetween and a cathode including the conductive layer 111, thus causing the conductor pillars 400 to precipitate from an exposed surface of the conductive layer 111 in the thickness direction of the photoresist layer. Thereafter, the photoresist layer is removed.

Figure 3C:
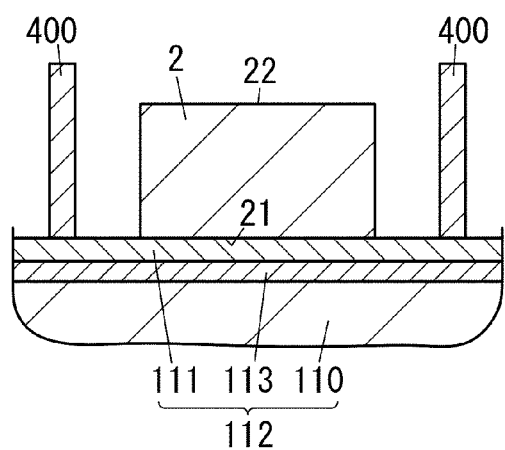

In the third step, as illustrated in FIG. 3C, the electronic component 2 is temporarily fixed on the conductive layer 111 of the multilayer body 112 on which the conductor pillars 400 are formed. More specifically, first, a resin adhesive layer (not illustrated) in a liquid state (paste state) is formed on the conductive layer 111. Next, with the surface 21 of the electronic component 2 facing the resin adhesive layer, the electronic component 2 is pushed against the resin adhesive layer. Consequently, in the third step, the electronic component 2 is temporarily fixed to the resin adhesive layer. The resin adhesive layer is preferably formed of a positive-type resist having photosensitivity.

Figure 4A:
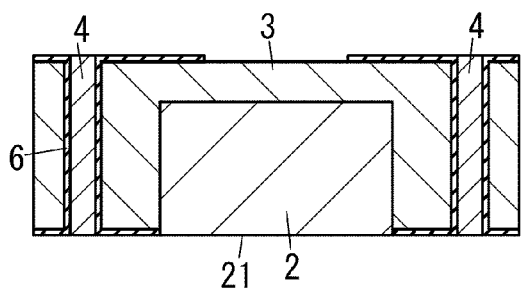
FIGS. 4A to 4E are sectional views for describing the method of manufacturing the above-mentioned electronic component module.
Figure 4D:
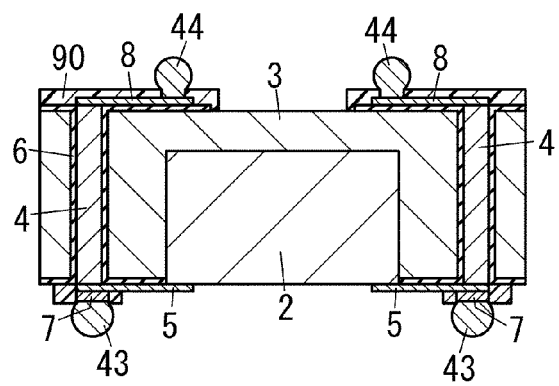

In the fourth step, as illustrated in FIG. 4D, an insulation layer 600, which is an element of the insulator 6, is formed. In other words, the insulation layer 600 is formed on exposed surfaces of the conductive layer 111 and the conductor pillars 400. An inorganic insulation material is used in the insulation layer 600. The inorganic insulation film used in the insulation layer 600 is, for example, a silicon oxide or a silicon nitride. The insulation layer 600 is formed on the conductive layer 111 and the conductor pillars 400 by, for example, CVD (Chemical Vapor Deposition) and a lithography technology.

Figure 4B:
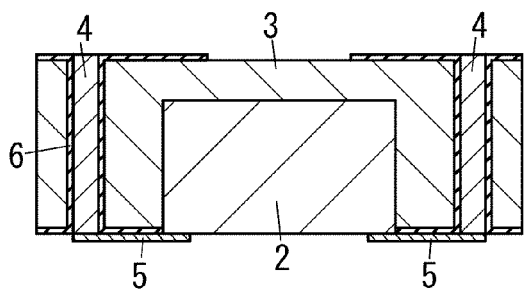
Figure 4E:
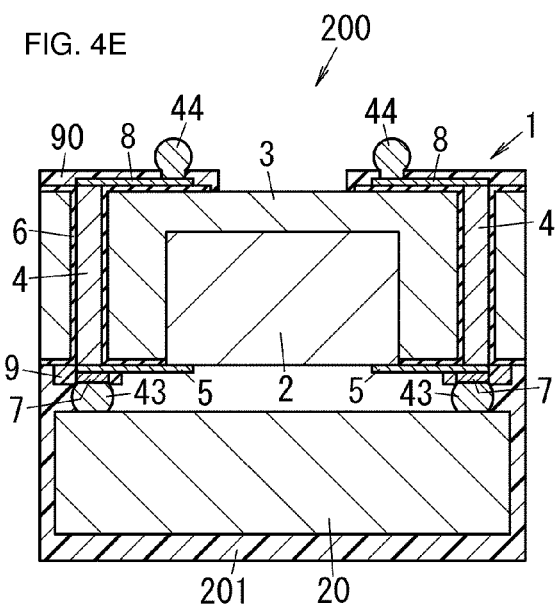

In the fifth step, as illustrated in FIG. 4E, a metal structure layer 30, which is an element of the structure body 3, is formed on the multilayer body 112 so as to cover the electronic component 2 and the insulation layer 600 that covers the conductor pillars 400 and the conductive layer 111. In short, in the fifth step, the metal structure layer 30 is formed on the conductive layer 111 of the multilayer body 112 with the insulation layer 600 interposed therebetween. The metal structure layer 30 includes a first surface 301 and a second surface 302 opposite to each other in the thickness direction of the metal structure layer 30. The first surface 301 of the metal structure layer 30 is in contact with the insulation layer 600. The metal structure layer 30 covers the rear surface 22 and the side surface 23 of the electronic component 2. In addition, the metal structure layer 30 covers side surfaces and top surfaces of the conductor pillars 400 with the insulation layer 600 interposed therebetween. Thus, the metal structure layer 30 is thicker than the structure body 3, and a portion of the metal structure layer 30 is interposed between the second surface 302 of the metal structure layer 30 and the top surfaces of the conductor pillars 400.

In the fifth step, the metal structure layer 30 containing a metal as a main component is formed by thermal spraying. The use of thermal spraying enables formation of a porous Cu structure body as the metal structure layer 30. The method of forming the metal structure layer 30 is not limited to the thermal spraying.

When the structure body 3 is a conductive structure body formed of a conductive resin that contains a metal or an alloy, the conductive resin is formed in the fifth step.

Figure 3F:
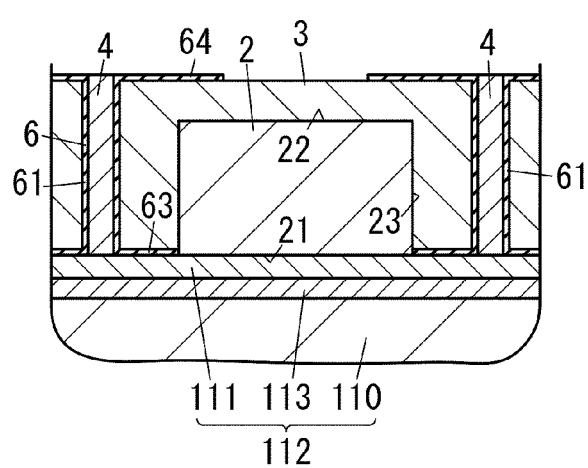

In the sixth step, as illustrated in FIG. 3F, the metal structure layer 30 is ground from the side of the second surface 302 opposite to the first surface 301 until the thickness of the metal structure layer 30 becomes equal to the thickness of the structure body 3, thus forming the structure body 3. In short, in the sixth step, the metal structure layer 30 is ground such that the top surfaces of the conductor pillars 400 are exposed and such that the second surface 302 of the metal structure layer 30 and the top surfaces of the conductor pillars 400 are substantially flush with each other. In the sixth step, exposing the top surfaces of the conductor pillars 400 is preferred, but it is not necessary to cause the top surfaces of the conductor pillars 400 and the second surface 302 of the metal structure layer 30 to be flush with each other. Through the sixth step, the structure body 3, the through wirings 4, and a portion of the insulator 6 are formed.

In addition, in the sixth step, the insulation portion 64, which is a portion of the insulator 6, is formed. More specifically, an insulation film, which is an element of the insulation portion 64, is formed on the top surfaces of the through wirings 4 and on the exposed surfaces of the structure body 3 and the insulation portions 61 of the insulator 6, and thereafter, an unnecessary portion of the insulation film is removed by using an etching technology. Consequently, the insulation portion 64 of the insulator 6 is formed.

In the seventh step, as illustrated in FIG. 4A, the multilayer body 112 and the resin adhesive layer are removed from a structure body that includes the electronic component 2, the structure body 3, the through wirings 4, the insulator 6, the multilayer body 112, and the resin adhesive layer (not illustrated). Consequently, in the seventh step, the surface 21 of the electronic component 2, both end surfaces (the first end surface 41 and the second end surface 42) of each of the through wirings 4, and a portion of the insulator 6 can be exposed. In the seventh step, the support body 110 of the multilayer body 112 is removed (peeled off) by, for example, reducing the adhesive force of the adhesive layer 113 that sticks the conductive layer 111 and the support body 110 to each other. The adhesive layer 113 is preferably formed of an adhesive whose adhesive force can be reduced by either of ultraviolet light, infrared light, and heat. The conductive layer 111 of the multilayer body 112 can be removed by, for example, wet etching. In addition, in the seventh step, the resin adhesive layer can be removed by developing the resin adhesive layer after exposing the resin adhesive layer to light.

In the eighth step, as illustrated in FIG. 4B, a plurality of the wiring layers 5 that electrically connect the electronic component 2 and the through wirings 4 to each other are formed. In the eighth step, the wiring layers 5 are formed by using, for example, sputtering or plating, a photolithography technology, and an etching technology.

Figure 4C:
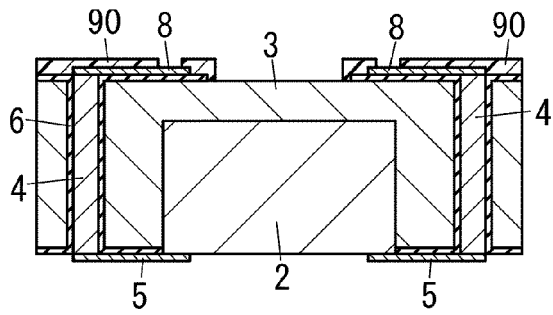

In the ninth step, as illustrated in FIG. 4C, a plurality of the external-connection wiring layers 8 are formed, and thereafter, the resist layers 90 are formed. In the ninth step, the external-connection wiring layers 8 are formed by using, for example, sputtering or plating, a photolithography technology, and an etching technology. In addition, in the ninth step, the resist layers 90 are formed by using, for example, a coating technology, such as spin coating, and a photolithography technology.

In the tenth step, as illustrated in FIG. 4D, a plurality of the electrodes 7 are formed, and thereafter, the resist layers 9 are formed. More specifically, in the tenth step, the electrodes are formed by using, for example, a thin-film formation technology, such as sputtering, a photolithography technology, and an etching technology. Thereafter, in the tenth step, the resist layers 9 are formed by using, for example, a coating technology, such as spin coating, and a photolithography technology. Thereafter, in the tenth step, conductive bumps 43 and 44 are formed. The conductive bumps 43 and 44 are solder bumps but not limited to solder bumps and may be, for example, gold bumps.

In the first step, when using, as the multilayer body 112, the multilayer body 112 that has a size with which an aggregate of a plurality of the electronic component modules 1 can be formed, it is possible to form an aggregate of a plurality of the electronic component modules 1 through the first step to the tenth step. In this case, a plurality of the electronic component modules 1 can be obtained by, for example, cutting and separating the aggregate of the plurality of electronic component modules 1 with a dicing machine into individual electronic component modules 1.

In the manufacture of the communication module 200 including the electronic component module 1, a plurality of the communication modules 200 may be obtained by performing the following eleventh step after the tenth step and then performing separation into individual communication modules 200.

In the eleventh step, as illustrated in FIG. 4E, for example, the electronic component 20, which is different from the electronic component 2 of the electronic component module 1, is mounted on the electronic component module 1. More specifically, in the eleventh step, a terminal electrode of the electronic component 20 and the electrodes 7 of the electronic component module 1 are electrically and mechanically connected to each other with the conductive bumps 43 interposed therebetween. Thereafter, a cover layer 201 that covers the electronic component 20 is formed. As the material of the cover layer 201, for example, a polyimide, benzocyclobutene, polybenzoxazole, or phenol resin, or a silicon resin is employable. The cover layer 201 has a function as a sealing layer that seals the electronic component 20 on the electronic component module 1.

(4) Effect

As described above, in the electronic component module 1 according to the first preferred embodiment, the structure body 3 has conductivity in a module structure in which the through wirings 4 extend through the structure body 3 that covers at least a portion of the electronic component 2. In such an electronic component module 1, thermal conductivity is higher in the structure body 3 having conductivity than in a structure body having electrical insulation properties. Accordingly, it is possible to efficiently dissipate the heat generated in the electronic component 2. In addition, due to the insulator 6 being disposed between the through wirings 4 and the structure body 3, it is possible to increase electrical insulation properties between the structure body 3 having conductivity and the through wirings 4. Moreover, due to the insulator 6 being disposed between the wiring layers 5 and the structure body 3, it is possible to increase electrical insulation properties between the structure body 3 having conductivity and the wiring layers 5.

In particular, the effect is large when the electronic component 2 is a high heat-generating IC, an acoustic wave filter, or a device, such as a power amplifier, in which heat generation is high. For example, when the electronic component 2 is a high heat-generating IC, it is possible to prevent malfunction, degradation in characteristics, and the like due to heat generation, by increasing heat dissipation of the electronic component module 1. In addition, when the electronic component 2 is an acoustic wave filter, it is possible to reduce the frequency shift amount during operation of the acoustic wave filter by increasing heat dissipation of the electronic component module 1.

Moreover, the electronic component module 1 according to the first preferred embodiment does not additionally require a structure for heat dissipation, which enables downsizing and a cost reduction.

In the electronic component module 1 according to the first preferred embodiment, the structure body 3 having conductivity holds the electronic component 2 in a state of being in contact with the electronic component 2. Consequently, the heat radiated from the electronic component 2 is easily transmitted to the structure body 3, which enables the heat generated in the electronic component 2 to be further efficiently dissipated.

In the electronic component module 1 according to the first preferred embodiment, the structure body 3 is made of a conductive material that contains Cu. Using Cu having high thermal conductivity in the structure body 3 enables the heat generated in the electronic component 2 to be further efficiently dissipated.

In the electronic component module 1 according to the first preferred embodiment, the structure body 3 is made of a conductor that contains a porous metal. Consequently, the structure body 3 is formed to be porous, which enables the structure body 3 to have high heat dissipation compared with when the structure body is made of a resin and to have a high elasticity compared with when the structure body is a bulk metal. As a result, it is possible to reduce a thermal stress with respect to the electronic component 2. In particular, when the electronic component 2 is an acoustic wave device, it is possible to maintain high reliability of the electronic component 2 by reducing a thermal stress with respect to the electronic component 2 because in-plane anisotropy of the linear expansion coefficient of a piezoelectric substrate is large in the acoustic wave device.

In the electronic component module 1 according to the first preferred embodiment, the structure body 3 is made of a conductor having low magnetic permeability. Consequently, it is possible to reduce or prevent degradation in magnetic characteristics of the electronic component 2. In particular, when the electronic component 2 is a high frequency device, the effect of reducing or preventing degradation in magnetic characteristics is large.

(5) Modification

As a modification of the first preferred embodiment, the structure body 3 may be formed of a conductor that contains a porous metal and a low elastic material. More specifically, the structure body 3 is made of a conductor that includes a porous Cu structure body impregnated with the low elastic material. A structure body that includes a Cu-particle necking body whose gaps are filled with the low elastic material is formed by impregnating the porous Cu structure body with the low elastic material.

In the electronic component module 1 according to the present modification, the structure body 3 is made of the conductor that includes the porous metal and the low elastic material. Consequently, it is possible to further efficiently dissipate the heat generated in the electronic component 2, compared with when the structure body is a porous metal, because gaps in the metal can be filled with the low elastic material having a low modulus of elasticity.

In the electronic component module 1 according to the first preferred embodiment, the second surface 32 of the structure body 3 is planar, and the shortest distance between the second surface 32 of the structure body 3 and the surface 21 of the electronic component 2 is longer than the shortest distance between the second surface 32 and the first surface 31. Consequently, the low profile of the electronic component module 1 according to the first preferred embodiment can be achieved.

In contrast, as a modification of the first preferred embodiment, the second surface 32 of the structure body 3 may be planar, and a distance between the second surface 32 of the structure body 3 and the surface 21 of the electronic component 2 may be shorter than a distance between the second surface 32 of the structure body 3 and the first surface 31 of the structure body 3. Consequently, the surface 21 of the electronic component is not easily damaged in the electronic component module 1 according to the present modification.

In addition, as another modification of the first preferred embodiment, the second surface 32 of the structure body 3 may be planar, and a distance between the second surface 32 of the structure body 3 and the surface 21 of the electronic component 2 may be identical to a distance between the second surface 32 of the structure body 3 and the first surface 31 of the structure body 3.

In short, the structure body 3 covers at least a portion of the side surface 23 of the electronic component 2. The expression "covers at least a portion of the side surface 23 and the rear surface 22 of the electronic component 2" means that, regarding the side surface 23 of the electronic component 2, the whole circumference of the side surface 23 is covered at least from a location in the side surface 23 of the electronic component 2 displaced from a first end on the side of the surface 21 toward a second end on the side of the rear surface 22 to the boundary between the side surface 23 and the rear surface 22, and includes the case in which the entirety of the side surface 23 of the electronic component 2 is covered.

In the example in FIG. 1, the electronic component module 1 includes, with respect to one electronic component 2, two wiring layers 5 directly connected to the electronic component 2. The number of the wiring layers 5 is, however, not limited to two. The number of the wiring layers 5 may be one or three or more.

In the example in FIG. 1, the electronic component module 1 includes one electronic component 2. The number of the electronic components 2 is, however, not limited to one and may be two or more. In this case, the plurality of electronic components 2 may be electronic components of the same type and may be electronic components of types that differ from each other, or, of the plurality of electronic components 2, only some of the electronic components 2 may be electronic components identical to each other. In addition, when the electronic component module 1 includes a plurality of the electronic components 2, the layout of the through wirings 4 and the wiring layers 5 may differ for each electronic component 2.

The electronic component module 1 according to each of the aforementioned modifications also achieves the same advantageous effects as with the electronic component module 1 according to the first preferred embodiment.

Second Preferred Embodiment

Figure 5:
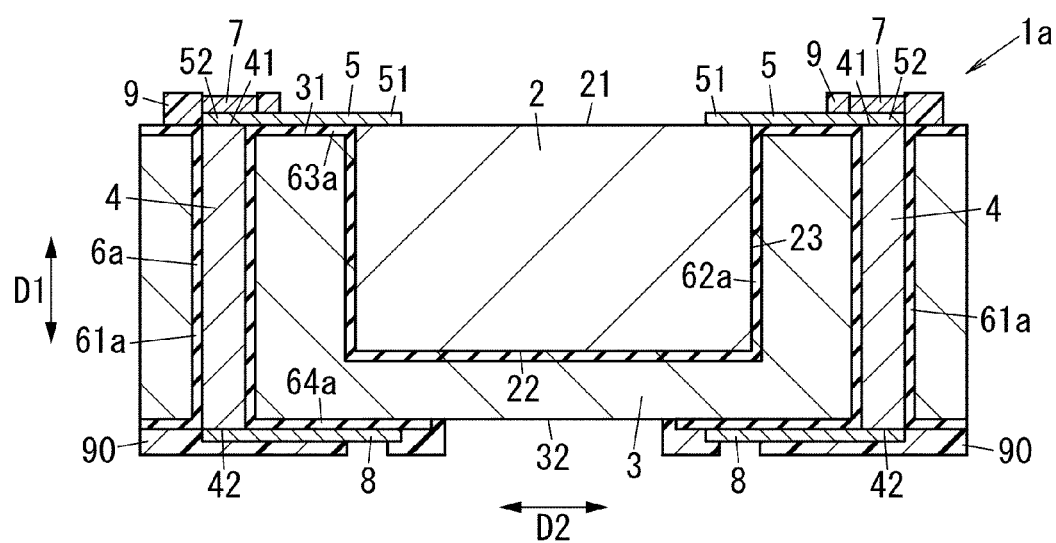
FIG. 5 is a sectional view of an electronic component module according to a second preferred embodiment of the present invention.

An electronic component module 1a according to a second preferred embodiment of the present invention differs from the electronic component module 1 (refer to FIG. 1) according to the first preferred embodiment in terms of that, as illustrated in FIG. 5, an insulator 6a is disposed not only between the structure body 3 and the through wirings 4 but also between the structure body 3 and the electronic component 2. Note that elements identical to those of the electronic component module 1 according to the first preferred embodiment are given the same signs, and description thereof is omitted.

The electronic component module 1a according to the second preferred embodiment includes, as an alternative to the insulator 6 (refer to FIG. 1) of the first preferred embodiment, the insulator 6a, such as that illustrated in FIG. 5.

The insulator 6a includes a plurality of first insulation portions 61a, a second insulation portion 62a, a third insulation portion 63a, and a fourth insulation portion 64a. As with the insulation portions 61 (refer to FIG. 1) of the first preferred embodiment, the first insulation portions 61a are disposed between the structure body 3 and the through wirings 4 and electrically insulate the structure body 3 and the through wirings 4 from each other. The second insulation portion 62a is disposed between the structure body 3 and the electronic component and electrically insulates the structure body 3 and the electronic component 2 from each other. More specifically, the second insulation portion 62a is formed to cover the rear surface and the side surface 23 of the electronic component 2 and electrically insulate the structure body 3 and, of the electronic component 2, a portion other than a terminal electrically connected to the wiring layers 5 from each other. As with the insulation portion 63 (refer to FIG. 1) of the first preferred embodiment, the third insulation portion 63a is disposed between and along the structure body 3 and the wiring layers 5 and electrically insulates the structure body 3 and the wiring layers 5 from each other. As with the insulation portion 64

(refer to FIG. 1) of the first preferred embodiment, the fourth insulation portion 64a is disposed between the structure body 3 and the external-connection wiring layers 8 and electrically insulates the structure body 3 and the external-connection wiring layers 8 from each other. Note that description of functions identical to those of the insulator 6 (refer to FIG. 1) of the first preferred embodiment is omitted.

The insulator 6a is made of an inorganic insulation material. The inorganic insulation material used in the insulator 6a is, for example, a silicon oxide or a silicon nitride. The insulator 6a is, for example, a thin-film insulation layer that is considerably thinner than the width of the through wirings 4 in the second direction D2.

Next, a non-limiting example of a method of manufacturing the electronic component module 1a according to the second preferred embodiment will be described with reference to FIGS. 6A to 6F and FIGS. 7A to 7E.

In the method of manufacturing the electronic component module 1a, first to tenth steps are sequentially performed after the electronic component 2 is prepared.

Figure 6A:
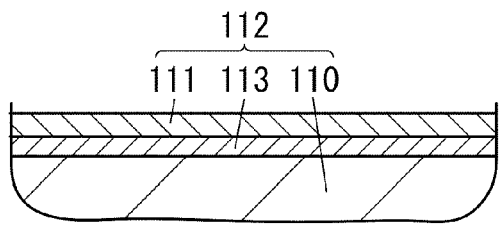
FIGS. 6A to 6F are sectional views for describing a method of manufacturing the above-mentioned electronic component module.

The first to third steps of the second preferred embodiment are identical to the first to third steps of the first preferred embodiment. In the first step, as illustrated in FIG. 6A, the multilayer body 112 is prepared. In the second step, as illustrated in FIG. 6B, a plurality of the conductor pillars 400, which serve as elements of the through wirings 4, are formed on the conductive layer 111 of the multilayer body 112. In the third step, as illustrated in FIG. 6C, the electronic component 2 is temporarily fixed on the conductive layer 111 of the multilayer body 112 on which the conductor pillars 400 are formed.

Figure 6D:
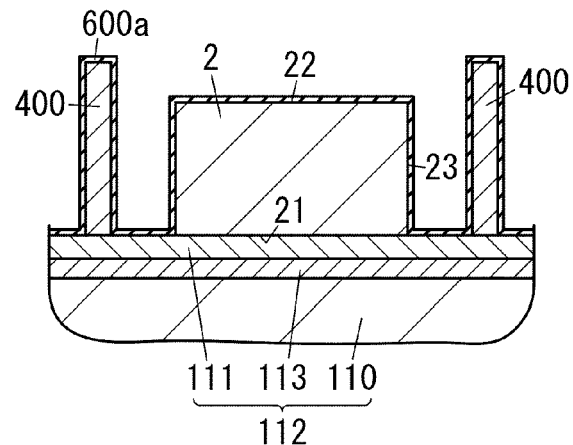
Figure 6B:
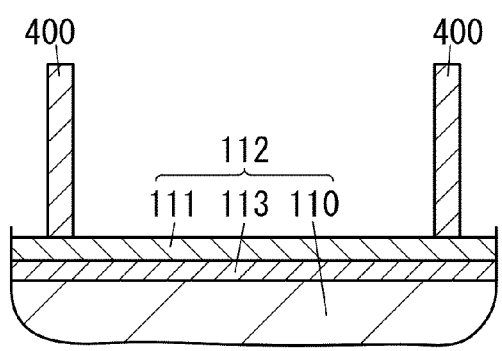

In the fourth step, as illustrated in FIG. 6D, an insulation layer 600a, which is an element of the insulator 6a, is formed. In the fourth step of the second preferred embodiment, the insulation layer 600a is formed not only on the exposed surfaces of the conductive layer 111 and the conductor pillars 400 but also on the rear surface 22 and the side surface 23 of the electronic component 2.

Figure 6E:
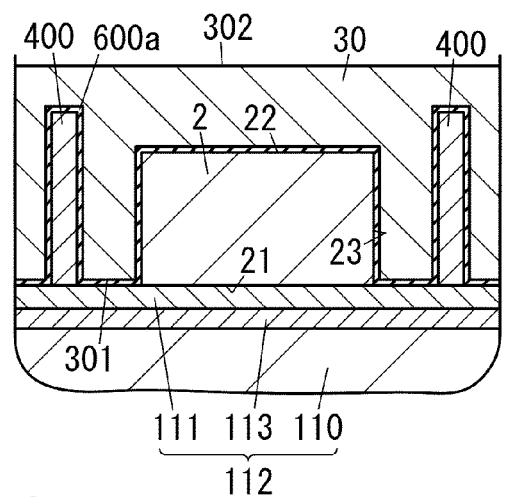
Figure 6C:
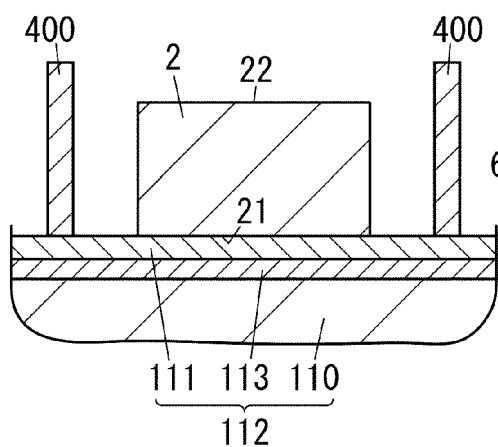

In the fifth step, as illustrated in FIG. 6E, the metal structure layer 30, which is an element of the structure body 3, is formed on the multilayer body 112 so as to cover the insulation layer 600a that covers the electronic component 2, the conductor pillars 400, and the conductive layer 111. In short, in the fifth step, the metal structure layer 30 is formed on the conductive layer 111 of the multilayer body 112 with the insulation layer 600a interposed therebetween.

In the fifth step, as with the fifth step of the first preferred embodiment, the metal structure layer 30 is formed by thermal spraying. The use of thermal spraying enables formation of a porous Cu structure body as the metal structure layer 30. In the second preferred embodiment, the method of forming the metal structure layer 30 is also not limited to thermal spraying.

Figure 6F:
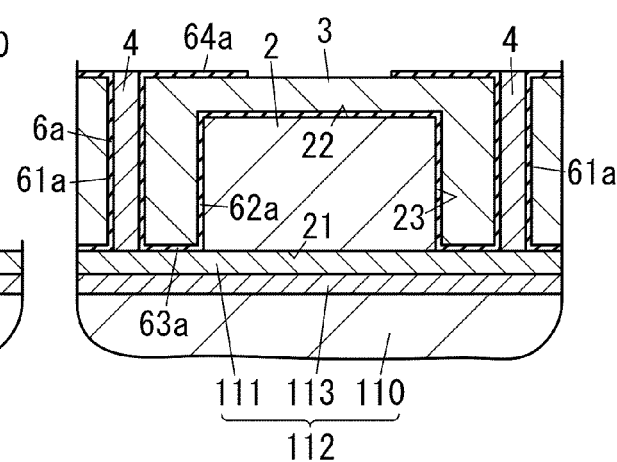

As illustrated in FIG. 6F, in the sixth step, as with the sixth step of the first preferred embodiment, the metal structure layer 30 is ground from the side of the second surface 302 until the thickness of the metal structure layer 30 becomes equal to the thickness of the structure body 3, thus forming the structure body 3. In addition, in the sixth step, the fourth insulation portion 64a, which is a portion of the insulator 6a, is formed.

Figure 7A:
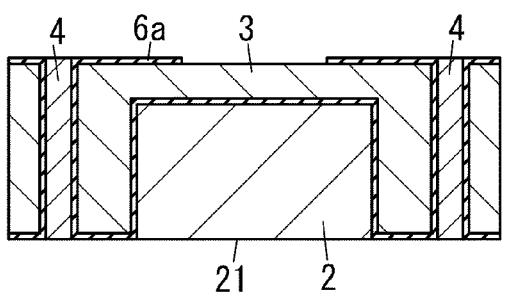
FIGS. 7A to 7E are sectional views for describing the method of manufacturing the above-mentioned electronic component module.
Figure 7B:
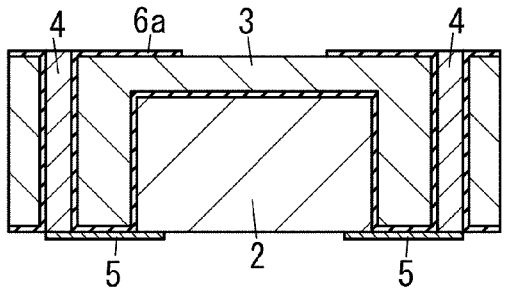
Figure 7C:
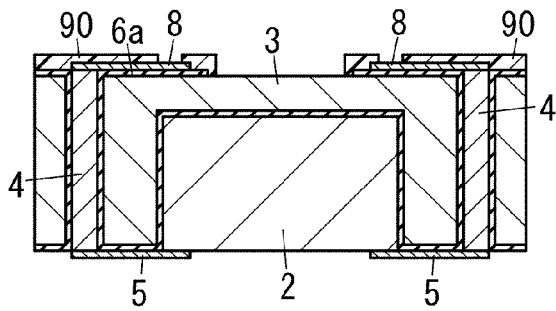
Figure 7D:
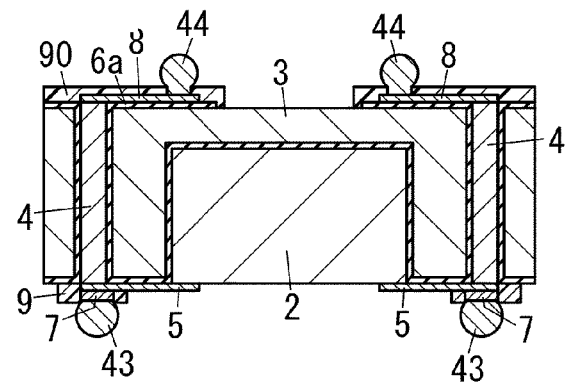

The seventh step to the tenth step of the second preferred embodiment are identical to the seventh step to the tenth step of the first preferred embodiment. In the seventh step, as illustrated in FIG. 7A, the multilayer body 112 and the resin adhesive layer are removed from a structure body that includes the electronic component 2, the structure body 3, the through wirings 4, the insulator 6a, the multilayer body 112, and the resin adhesive layer (not illustrated). In the eighth step, as illustrated in FIG. 7B, a plurality of the wiring layers 5 that electrically connect the electronic component 2 and the through wirings 4 to each other are formed. In the ninth step, as illustrated in FIG. 7C, a plurality of the external-connection wiring layers 8 and the resist layers 90 are formed. In the tenth step, as illustrated in FIG. 7D, a plurality of the electrodes 7, a plurality of the conductive bumps 43 and 44, and the resist layers 9 are formed.

Figure 7E:
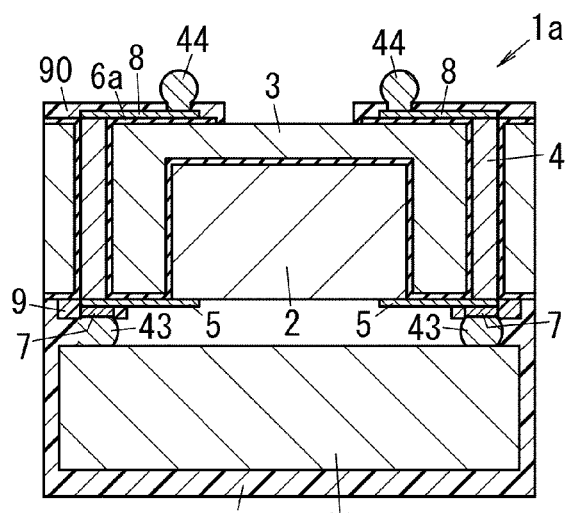

As illustrated in FIG. 7E, in the eleventh step, as with the eleventh step of the first preferred embodiment, the electronic component 20 is mounted on the electronic component module 1a, and thereafter, the cover layer 201 that covers the electronic component 20 is formed.

As described above, in the electronic component module 1a according to the second preferred embodiment, the insulator 6a is disposed not only between the structure body 3 and the through wirings 4 but also between the structure body 3 and the electronic component 2. Electrical insulation properties between the structure body 3 having conductivity and a conductive portion of the electronic component 2 can be improved.

The insulator 6a of the second preferred embodiment is applicable not only to the electronic component module 1 according to the first preferred embodiment but also to the electronic component module 1 according to each modification of the first preferred embodiment.

Each of the first and second preferred embodiments described above is merely one of various preferred embodiments of the present invention. The first and second preferred embodiments can be variously changed in accordance with design and the like provided that an object of the present invention is achieved.

Based on the preferred embodiments, modifications thereof, and the like described above that the following aspects are disclosed.

The electronic component module (1; 1a) according to a first aspect includes an electronic component (2), a structure body (3), a through wiring (4), and an insulator (6; 6a). The structure body (3) covers at least a portion of the electronic component (2) and has conductivity. The through wiring (4) extends through the structure body (3). The insulator (6; 6a) is disposed at least between the through wiring (4) and the structure body (3).

In the electronic component module (1; 1a) according to the first aspect, in a module structure in which the through wiring (4) extends through the structure body (3) that covers at least a portion of the electronic component (2), the structure body (3) has conductivity. In such an electronic component module (1; 1a), thermal conductivity is higher in the structure body (3) having conductivity than in a structure body having electrical insulation properties. Thus, it is possible to more efficiently dissipate the heat generated in the electronic component (2). In addition, it is possible to increase electrical insulation properties between the structure body (3) having conductivity and the through wiring (4) because the insulator (6; 6a) is disposed between the through wiring (4) and the structure body (3).

The electronic component module (1; 1a) according to a second aspect further includes a wiring layer (5) in the first aspect. The wiring layer (5) electrically connects the electronic component (2) and the through wiring (4) to each other.

The electronic component module (1; 1a) according to a third aspect includes the electronic component (2), the structure body (3), the through wiring (4), the wiring layer (5), and the insulator (6; 6a). The structure body (3) covers at least a portion of the electronic component (2) and has conductivity. The through wiring (4) extends through the structure body (3). The wiring layer (5) electrically connects the electronic component (2) and the through wiring (4) to each other. The insulator (6; 6a) is disposed at least between the wiring layer (5) and the structure body (3).

In the electronic component module (1; 1a) according to the third aspect, in a module structure in which the through wiring (4) extends through the structure body (3) that covers at least a portion of the electronic component (2), the structure body (3) has conductivity. In such an electronic component module (1; 1a), thermal conductivity is higher in the structure body (3) having conductivity than in a structure body having electrical insulation properties. Thus, it is possible to more efficiently dissipate the heat generated in the electronic component (2). In addition, it is possible to increase electrical insulation properties between the structure body (3) having conductivity and the wiring layer (5) because the insulator (6; 6a) is disposed between the wiring layer (5) and the structure body (3).

In the first to third aspects, the effects are large, in particular, when the electronic component (2) is a high heat-generating IC, an acoustic wave filter, or a device, such as a power amplifier, in which heat generation is high. For example, when the electronic component (2) is a high heat-generation IC, it is possible to reduce malfunction due to heat generation, by increasing heat dissipation of the electronic component module (1; 1a). In addition, when the electronic component (2) is an acoustic wave filter, it is possible to reduce a frequency shift amount during operation of the acoustic wave filter by increasing heat dissipation of the electronic component module (1; 1a).

Moreover, the electronic component module (1; 1a) according to the first to third aspects does not require an additional structure for heat dissipation, which enables downsizing and a cost reduction.

In the electronic component module (1) according to a fourth aspect, the structure body (3) is in contact with the electronic component (2) in any one of the first to third aspect.

In the electronic component module (1) according to the fourth aspect, the structure body (3) having conductivity holds the electronic component (2) in a state of being in contact with the electronic component (2). Consequently, the heat radiated from the electronic component (2) is easily transmitted to the structure body (3), which enables the heat generated in the electronic component (2) to be further efficiently dissipated.

In the electronic component module (1a) according to a fifth aspect, an insulator (6a) includes a first insulation portion (61a) and a second insulation portion (62a) in the first or second aspect. The first insulation portion (61a) is disposed between the structure body (3) and the through wiring (4). The second insulation portion (62a) is disposed between the structure body (3) and the electronic component (2).

In the electronic component module (1a) according to the fifth aspect, the insulator (6a) is disposed not only between the structure body (3) and the through wiring (4) but also between the structure body (3) and the electronic component (2). Electrical insulation properties between the structure body (3) having conductivity and a conductive portion of the electronic component (2) can be increased.

In the electronic component module (1a) according to a sixth aspect, the insulator (6a) includes a third insulation portion (63a) and the second insulation portion (62a) in the third aspect. The third insulation portion (63a) is disposed between the structure body (3) and the wiring layer (5). The second insulation portion (62a) is disposed between the structure body (3) and the electronic component (2).

In the electronic component module (1a) according to the sixth aspect, the insulator (6a) is disposed not only between the structure body (3) and the wiring layer (5) but also between the structure body (3) and the electronic component (2). Electrical insulation properties between the structure body (3) having conductivity and a conductive portion of the electronic component (2) can be increased.

In the electronic component module (1; 1a) according to a seventh aspect, the structure body (3) is made of a conductive material that includes Cu in any one of the first to sixth aspects.

In the electronic component module (1; 1a) according to the seventh aspect, the structure body (3) is made of the conductive material that contains Cu. The use of Cu, which has high thermal conductivity, in the structure body (3) enables the heat generated in the electronic component (2) to be further efficiently dissipated.

In the electronic component module (1; 1a) according to an eighth aspect, the structure body (3) is made of a conductor that contains a porous metal in any one of the first to seventh aspects.

In the electronic component module (1; 1a) according to the eighth aspect, the structure body (3) is made of the conductor that contains the porous metal. Consequently, the structure body (3) is formed to be porous, and it is thus possible to enable the structure body (3) to have high elasticity, compared with when the structure body is a bulk metal, while having high heat dissipation, compared with when the structure body is a resin. As a result, it is possible to reduce the thermal stress with respect to the electronic component (2). In particular, when the electronic component (2) is an acoustic wave device, it is possible to maintain high reliability of the electronic component (2) by reducing the thermal stress with respect to the electronic component (2) because in-plane anisotropy of the linear expansion coefficient of the piezoelectric substrate is large in acoustic wave devices.

In the electronic component module (1; 1a) according to a ninth aspect, the structure body (3) is made of a conductor that contains a porous metal and a low elastic material in the eighth aspect.

In the electronic component module (1; 1a) according to the ninth aspect, the structure body (3) is made of the conductor that contains the porous metal and the low elastic material. Consequently, gaps in the metal can be filled with the low elastic material having a low modulus of elasticity, and it is thus possible to further efficiently dissipate the heat generated in the electronic component (2), compared with when the structure is a porous metal.

In the electronic component module (1; 1a) according to a tenth aspect, the structure body (3) is made of a conductor that has low magnetic permeability in any one of the first to ninth aspects.

In the electronic component module (1; 1a) according to the tenth aspect, the structure body (3) is made of the conductor that has low magnetic permeability. Consequently, it is possible to reduce or prevent degradation in magnetic characteristics of the electronic component (2). In particular, when the electronic component (2) is a high frequency device, the effect of reducing or preventing degradation in magnetic characteristics is large.

In the electronic component module (1; 1a) according to an eleventh aspect, the insulator (6; 6a) is made of an inorganic insulation material in any one of the first to tenth aspects.

The electronic component module (1; 1a) according to a twelfth aspect further includes an electrode (7) and a resist layer (9) in the second or third aspect. The electrode (7) is formed on the wiring layer (5). The resist layer (9) is formed on the wiring layer (5). The resist layer (9) is made of a material that has lower wettability than the electrode (7) and the wiring layer (5).

In the electronic component module (1; 1a) according to the twelfth aspect, it is possible to prevent solder from spreading out on the wiring layer (5) during joining of the electrode (7) by soldering to a different electronic component (20) and the like.

The electronic component module (1; 1a) according to a thirteenth aspect further includes an external-connection wiring layer (8) and a resist layer (90) in the first, second, or fifth aspect. The external-connection wiring layer (8) is electrically connected to the through wiring (4). The resist layer (90) is formed on the external-connection wiring layer (8). The resist layer (90) is made of a material that has lower wettability than the external-connection wiring layer (8).

In the electronic component module (1; 1a) according to the thirteenth aspect, it is possible to prevent solder from spreading out on the external-connection wiring layer (8) during joining of the external-connection wiring layer (8) by soldering to a circuit board (10) and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising:
   an electronic component;
   a structure body that covers at least a portion of the electronic component, and an entirety or substantially an entirety of the structure body has electrical conductivity;
   a through wiring that extends through the structure body; and
   an insulator disposed at least between the through wiring and the structure body; wherein
   the structure body is in contact with the electronic component.

2. The electronic component module according to claim 1, further comprising:
   a wiring layer that electrically connects the electronic component and the through wiring to each other.

3. The electronic component module according to claim 2, further comprising:
   an electrode on the wiring layer; and
   a resist layer on the wiring layer, the resist layer being in a location that differs from a location of the electrode; wherein
   the resist layer is made of a material that has lower wettability than the electrode and the wiring layer.

4. The electronic component module according to claim 1, wherein the insulator includes:
   a first insulation portion disposed between the structure body and the through wiring; and
   a second insulation portion disposed between the structure body and the electronic component.

5. The electronic component module according to claim 1, wherein the structure body is made of a conductive material that contains Cu.

6. The electronic component module according to claim 1, wherein the structure body is made of a conductor that contains a porous metal.

7. The electronic component module according to claim 1, wherein the structure body is made of a conductor that has low magnetic permeability.

8. The electronic component module according to claim 1, wherein the insulator is made of an inorganic insulation material.

9. The electronic component module according to claim 1, further comprising:
   an external-connection wiring layer electrically connected to the through wiring; and
   a resist layer on the external-connection wiring layer; wherein
   the resist layer is made of a material that has lower wettability than the external-connection wiring layer.

10. The electronic component module according to claim 1, wherein at least a portion of the electronic component is disposed inside of the structure body.

11. The electronic component module according to claim 1, wherein the structure body and the electronic component overlap one another in a direction that is perpendicular or substantially perpendicular to a direction in which the through wiring extends through the structure body.

12. An electronic component module comprising:
    an electronic component;
    a structure body that covers at least a portion of the electronic component, and an entirety or substantially an entirety of the structure body has electrical conductivity;
    a through wiring that extends through the structure body;
    a wiring layer that electrically connects the electronic component and the through wiring to each other; and
    an insulator that is disposed at least between the wiring layer and the structure body; wherein
    the structure body is in contact with the electronic component.

13. The electronic component module according to claim 12, wherein the insulator includes:
    a first insulation portion disposed between the structure body and the through wiring; and
    a second insulation portion disposed between the structure body and the electronic component.

14. The electronic component module according to claim 12, wherein the insulator includes:
    a third insulation portion disposed between the structure body and the wiring layer; and
    a second insulation portion disposed between the structure body and the electronic component.

15. The electronic component module according to claim 12, wherein the structure body is made of a conductive material that contains Cu.

16. The electronic component module according to claim 12, wherein the structure body is made of a conductor that contains a porous metal.

17. The electronic component module according to claim 12, wherein the structure body is made of a conductor that has low magnetic permeability.

18. The electronic component module according to claim 12, wherein at least a portion of the electronic component is disposed inside of the structure body.

* * * * *